(12) United States Patent
Niwa et al.

(10) Patent No.: US 9,704,952 B2
(45) Date of Patent: Jul. 11, 2017

(54) SEMICONDUCTOR DEVICE AND METHOD FOR MANUFACTURING SEMICONDUCTOR DEVICE

(71) Applicant: TOYODA GOSEI CO., LTD., Kiyosu-shi (JP)

(72) Inventors: Takaki Niwa, Kiyosu (JP); Masayoshi Kosaki, Kiyosu (JP); Takahiro Fujii, Kiyosu (JP); Tohru Oka, Kiyosu (JP); Yukihisa Ueno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/065,708

(22) Filed: Mar. 9, 2016

(65) Prior Publication Data
US 2016/0284843 A1  Sep. 29, 2016

(30) Foreign Application Priority Data
Mar. 23, 2015 (JP) ................................ 2015-059436

(51) Int. Cl.
*H01L 29/06* (2006.01)
*H01L 29/20* (2006.01)
(Continued)

(52) U.S. Cl.
CPC ...... *H01L 29/0684* (2013.01); *H01L 21/0254* (2013.01); *H01L 21/0262* (2013.01); *H01L 21/02458* (2013.01); *H01L 21/02576* (2013.01); *H01L 21/02579* (2013.01); *H01L 27/0255* (2013.01); *H01L 29/0657* (2013.01); *H01L 29/2003* (2013.01); *H01L 29/4236* (2013.01)

(58) Field of Classification Search
None
See application file for complete search history.

(56) References Cited

U.S. PATENT DOCUMENTS 6,054,748 A * 4/2000 Tsukuda ............... H01L 29/0615
257/487
2003/0034495 A1 2/2003 Casady et al.
(Continued)

FOREIGN PATENT DOCUMENTS

JP  H02-005482 A  1/1990
JP  2005-520322 A  7/2005
(Continued)

*Primary Examiner* — Tom Thomas
*Assistant Examiner* — Steven B Gauthier
(74) *Attorney, Agent, or Firm* — McGinn IP Law Group, PLLC

(57) ABSTRACT

An object is to provide a technique that suppresses decrease in the breakdown voltage of a protective element. There is provided a semiconductor device that comprises a vertical MOS transistor and a protective element. A first nitride semiconductor layer has a convex that is protruded toward a second nitride semiconductor layer. The convex has a top face placed at a position to overlap with at least part of an ohmic electrode of a second conductive type when viewed from a stacking direction of a stacked body. The thickness of the second nitride semiconductor layer in a portion which a bottom face of a trench is in contact with is greater than the thickness of the second nitride semiconductor layer in a portion which the top face of the convex is in contact with.

15 Claims, 15 Drawing Sheets

(51) Int. Cl.
*H01L 27/02* (2006.01)
*H01L 21/02* (2006.01)
*H01L 29/423* (2006.01)

(56) References Cited

U.S. PATENT DOCUMENTS

| | | | |
|---|---|---|---|
| 2007/0278472 A1 | 12/2007 | Mauder et al. | |
| 2011/0291185 A1* | 12/2011 | Grover | H01L 29/404 257/334 |
| 2013/0087829 A1 | 4/2013 | Tanabe et al. | |
| 2014/0353678 A1* | 12/2014 | Kawakami | H01L 21/266 257/76 |

FOREIGN PATENT DOCUMENTS

| | | |
|---|---|---|
| JP | 2006-073626 A | 3/2006 |
| JP | 2007-324601 A | 12/2007 |
| JP | 2012-033897 A | 2/2012 |

* cited by examiner

Fig.14A
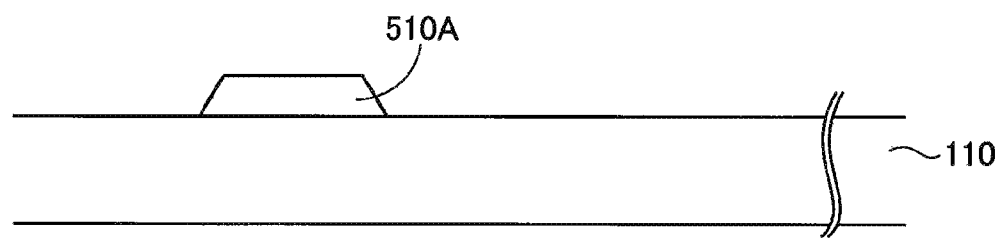
Fig.14B
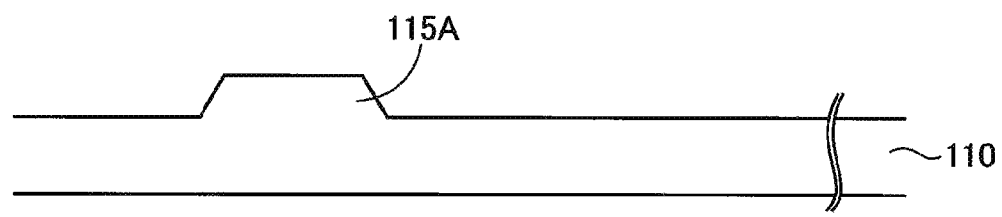
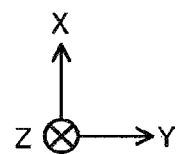

Fig.15A
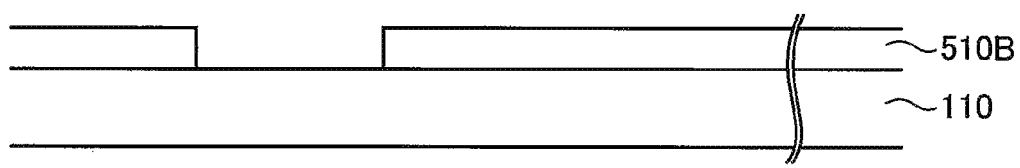
Fig.15B
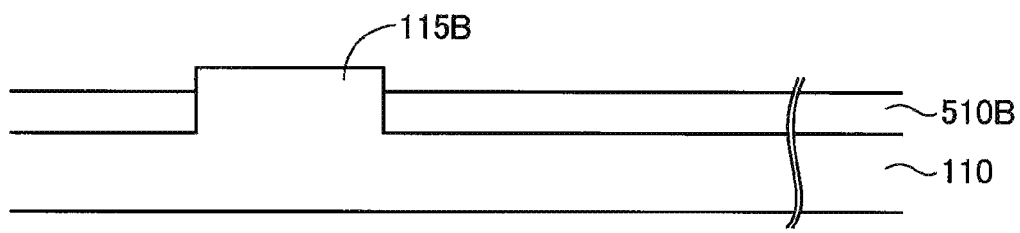
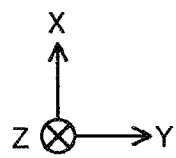

SEMICONDUCTOR DEVICE AND METHOD FOR MANUFACTURING SEMICONDUCTOR DEVICE

CROSS REFERENCE TO RELATED APPLICATION

The present application claims priority from Japanese patent application No. 2015-059436 filed on Mar. 23, 2015, the entirety of disclosures of which is hereby incorporated by reference into this application.

BACKGROUND

Field

The present invention relates to a semiconductor device and a method for manufacturing the semiconductor device.

Description of Related Art

A technique that provides a PN junction diode as a protective element in combination with a vertical MOSFET has been known, with a view to enhancing the breakdown resistance of a semiconductor device. In this proposed technique, the PN junction diode serves as the protective element. It is accordingly preferable to form a PN junction diode including a thinner $N^-$ layer than an $N^-$ drift layer of the vertical MOSFET. JP 2005-520322A discloses a technique of reducing the thickness of an $N^-$ layer placed between electrodes forming a protective diode by removing part of the $N^-$ layer and forming a P-type layer in a removed location by regrowth.

In an application that employs a nitride semiconductor as the semiconductor, the inventors of the present application have found a problem with regard to the technique described in JP 2005-520322A that an unintended N-type carrier is generated at a regrowth interface to decrease the breakdown voltage of the PN junction diode. Other needs with regard to the prior art semiconductor device include downsizing, resource saving, easy manufacture, accuracy of manufacturing and improvement of workability.

SUMMARY

In order to solve at least part of the problems described above, the invention may be implemented by aspects described below.

(1) According to one aspect of the invention, a semiconductor device is provided. The semiconductor device has a vertical MOS transistor including: a stacked body formed by stacking a first nitride semiconductor layer of a first conductive type, a second nitride semiconductor layer of the first conductive type, a third nitride semiconductor layer of a second conductive type and a fourth nitride semiconductor layer of the first conductive type in this sequence; and a first electrode arranged to be in contact with an opposite surface of the first nitride semiconductor layer that is opposite to a surface in contact with the second nitride semiconductor layer, wherein a trench is formed to pass through the third nitride semiconductor layer and the fourth nitride semiconductor layer and reach the second nitride semiconductor layer; and a protective element including: the first electrode; and an ohmic electrode to the second conductive type arranged to be in contact with an opposite surface of the third nitride semiconductor layer that is opposite to a surface in contact with the second nitride semiconductor layer, wherein the second nitride semiconductor layer has a lower impurity concentration of the first conductive type than the first nitride semiconductor layer, the first nitride semiconductor layer has a convex that is protruded toward the second nitride semiconductor layer, wherein the convex has a top face placed at a position to overlap with at least part of the ohmic electrode to the second conductive type, when viewed from a stacking direction of the stacked body, and thickness of the second nitride semiconductor layer in a portion which a bottom face of the trench is in contact with is greater than thickness of the second nitride semiconductor layer in a portion which the top face of the convex is in contact with. In the semiconductor device of this aspect, the first nitride semiconductor layer has the convex that is protruded toward the second nitride semiconductor layer. The thickness of the second nitride semiconductor layer on the bottom face of the trench is greater than the thickness of the second nitride semiconductor layer on the top face of the convex. This configuration suppresses decrease in the breakdown voltage of the protective element.

(2) According to one embodiment of the semiconductor device of the above aspect. The fourth nitride semiconductor layer may be placed at a position that does not overlap with the top face of the convex, when viewed from the stacking direction. The semiconductor device of the above aspect is configured such that electric current flows in the protective element, before flowing from the fourth nitride semiconductor layer to the convex. This configuration suppresses decrease in the breakdown voltage of the protective element.

(3) According to one embodiment, the semiconductor device of any of the above aspect may further comprise a step that is provided on an opposite side to a side where the trench is placed across the convex when viewed from the stacking direction and is formed to pass through the third nitride semiconductor layer and reach the second nitride semiconductor layer, wherein the thickness of the second nitride semiconductor layer in the portion which the top face of the convex is in contact with is equal to or less than thickness of the second nitride semiconductor layer in a portion which a bottom face of the step is in contact with. The semiconductor device of the above aspect is configured such that electric current flows in the protective element, before flowing between the step and the first electrode. This configuration suppresses breakdown of the semiconductor device.

(4) According to one embodiment of the semiconductor device of any of the above aspect, distance between the bottom face of the step and the convex may be greater than the thickness of the second nitride semiconductor layer in the portion which the bottom face of the step is in contact with. The semiconductor device of the above aspect is configured such that electric current flows in the protective element, before flowing from the first electrode across the convex to the step. This configuration suppresses breakdown of the semiconductor device.

(5) According to one embodiment, the semiconductor device of any of the above aspect may further comprise an ohmic electrode to the first conductive type arranged to be in contact with an opposite surface of the fourth nitride semiconductor layer that is opposite to a surface in contact with the third nitride semiconductor layer. The semiconductor device of this aspect includes the ohmic electrode to the first conductive type. This configuration reduces the on resistance of the vertical MOS transistor.

(6) According to one embodiment, the semiconductor device of any of the above aspect may further comprise a first wiring configured to electrically connect the ohmic electrode to the first conductive type with the ohmic electrode to the second conductive type, wherein the first wiring is arranged to cover a side face of the step via an insulating film. The semiconductor device of this aspect includes the first wiring. This suppresses the potential crowding on the side face of the step and results in suppressing breakdown of the semiconductor device.

(7) According to one embodiment of the semiconductor device of any of the above aspect, each of the first nitride semiconductor layer, the second nitride semiconductor layer, the third nitride semiconductor layer and the fourth nitride semiconductor layer may be made of a gallium-containing nitride semiconductor. The semiconductor device of this aspect suppresses decrease in the breakdown voltage of the protective element.

(8) According to one embodiment of the semiconductor device of any of the above aspect, the first nitride semiconductor layer may be made of gallium nitride. The semiconductor device of this aspect suppresses decrease in the breakdown voltage of the protective element.

(9) According to one embodiment of the semiconductor device of any of the above aspect, the first nitride semiconductor layer may be a nitride gallium substrate. The semiconductor device of this aspect suppresses decrease in the breakdown voltage of the protective element.

(10) According to one embodiment of the semiconductor device of any of the above aspect, the convex may have a side face that is inclined relative to a top face of the convex. The semiconductor device of this aspect suppresses decrease in the breakdown voltage of the protective element.

(11) According to one embodiment of the semiconductor device of any of the above aspect, the convex may have a side face provided as an a-face or an m-face and a top face provided as a c-face. The semiconductor device of this aspect suppresses decrease in the breakdown voltage of the protective element.

(12) According to another aspect of the invention, a method for manufacturing a semiconductor device is provided. The method for manufacturing a semiconductor device has: forming a convex to be protruded on a surface of a first nitride semiconductor layer of a first conductive type; stacking a second nitride semiconductor layer of the first conductive type that has a lower impurity concentration than the first nitride conductive layer, and a third nitride semiconductor layer of a second conductive type in this sequence on a surface of the first nitride semiconductor layer with the convex formed thereon; forming a trench to pass through the third nitride semiconductor layer and reach the second nitride semiconductor layer; forming a first electrode on an opposite surface of the first nitride semiconductor layer that is opposite to the surface in contact with the second nitride semiconductor layer; and forming an ohmic electrode to the second conductive type on an opposite surface of the third nitride semiconductor layer that is opposite to a surface in contact with the second nitride semiconductor layer, to be placed at a position to overlap with at least part of a top face of the convex in a stacking direction, wherein thickness of the second nitride semiconductor layer in a portion which a bottom face of the trench is in contact with is greater than thickness of the second nitride semiconductor layer in a portion which the top face of the convex is in contact with. The method for manufacturing the semiconductor device of this aspect suppresses decrease in the breakdown voltage of the protective element that includes the first electrode and the ohmic electrode to the second conductive type.

(13) According to one embodiment of the method for manufacturing a semiconductor device of the above aspect, distance between the top face of the convex and the bottom face of the trench may be greater than the thickness of the second nitride semiconductor layer in the portion which the bottom face of the step is in contact with. According to the method for manufacturing the semiconductor device of this aspect, the drain current of the vertical MOS transistor flows between the side face of the trench and the first nitride semiconductor layer below the trench. The breakdown voltage of the vertical MOS transistor is accordingly not reduced by the presence of the convex. This configuration prevents the breakdown voltage of the vertical MOS transistor from becoming lower than the breakdown voltage of the protective element and thereby suppresses breakdown of the vertical MOS transistor.

(14) According to one embodiment, the method for manufacturing a semiconductor device of any of the above aspect may further comprise forming a fourth nitride semiconductor layer of the first conductive type on the opposite surface of the third nitride semiconductor layer that is opposite to the surface in contact with the second nitride semiconductor layer, wherein the fourth nitride semiconductor layer is placed at a position that does not overlap with the top face of the convex in the stacking direction. According to the method for manufacturing the semiconductor device of this aspect, the drain current of the vertical MOS transistor flows between the fourth nitride semiconductor layer and the first nitride semiconductor layer below the trench. The breakdown voltage of the vertical MOS transistor is accordingly not reduced by the presence of the convex. This configuration prevents the breakdown voltage of the vertical MOS transistor from becoming lower than the breakdown voltage of the protective element and thereby suppresses breakdown of the vertical MOS transistor.

(15) According to one embodiment of the method for manufacturing a semiconductor device of the above aspect, each of the first nitride semiconductor layer, the second nitride semiconductor layer, the third nitride semiconductor layer and the fourth nitride semiconductor layer may be made of a gallium-containing nitride semiconductor. The method for manufacturing the semiconductor device of this aspect suppresses decrease in the breakdown voltage of the protective element that includes the first electrode and the ohmic electrode to the second conductive type.

(16) According to one embodiment of the method for manufacturing a semiconductor device of the above aspect, the first nitride semiconductor layer may be a nitride gallium substrate. The method for manufacturing the semiconductor device of this aspect suppresses decrease in the breakdown voltage of the protective element that includes the first electrode and the ohmic electrode to the second conductive type.

All the plurality of components included in each of the aspects of the invention described above are not essential, but some components among the plurality of components may be appropriately changed, omitted or replaced with other components or part of the limitations may be deleted, in order to solve part or all of the problems described above or in order to achieve part or all of the advantageous effects described herein. In order to solve part or all of the problems described above or in order to achieve part or all of the advantageous effects described herein, part or all of the technical features included in one aspect of the invention described above may be combined with part or all of the technical features included in another aspect of the invention described above to provide still another independent aspect of the invention.

The invention may be implemented by any of various aspects other than the semiconductor device and the method for manufacturing the semiconductor device described above. For example, the invention may be implemented by electrical equipment with the semiconductor device of any of the above aspects is incorporated or an apparatus for manufacturing the semiconductor device of any of the above aspects.

In the semiconductor device of the above aspect, the first nitride semiconductor layer has the convex that is protruded toward the second nitride semiconductor layer. The thickness of the second nitride semiconductor layer on the bottom face of the trench is greater than the thickness of the second nitride semiconductor layer on the top face of the convex. This configuration suppresses decrease in the breakdown voltage of the protective element. The method for manufacturing the semiconductor device of the above aspect suppresses decrease in the breakdown voltage of the protective element that includes the first electrode and the ohmic electrode to the second conductive type.

BRIEF DESCRIPTION OF DRAWINGS

FIG. 14A is a diagram illustrating a process of forming a convex;

FIG. 14B is a diagram illustrating a process of forming a convex;

FIG. 15A is a diagram illustrating a process of forming a convex by regrowth;

FIG. 15B is a diagram illustrating a process of forming a convex by regrowth;

DESCRIPTION OF EMBODIMENTS

A. First Embodiment

A1. Configuration of Semiconductor Device 10

Figure 1:
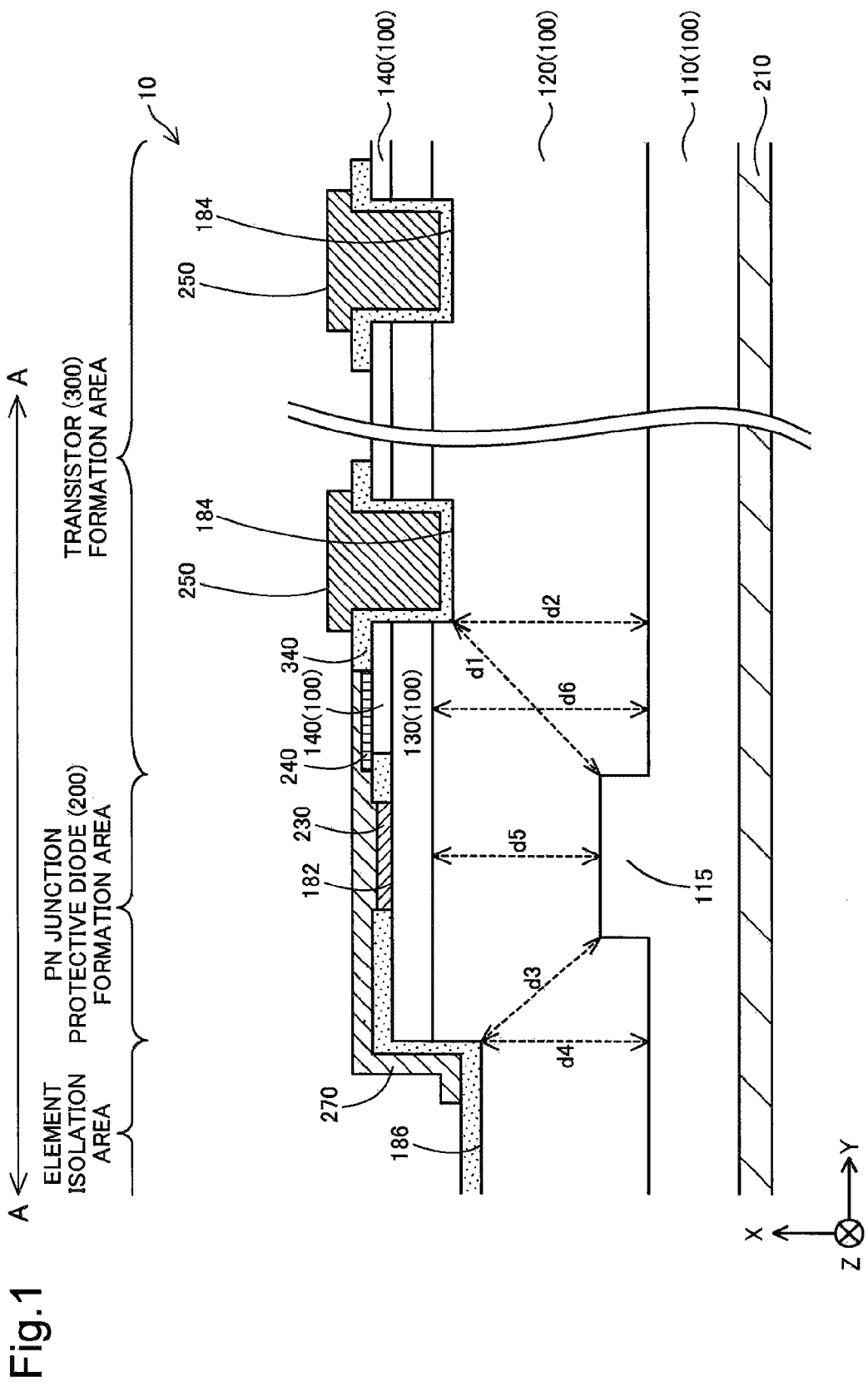
FIG. 1 is a sectional view schematically illustrating the configuration of a semiconductor device according to a first embodiment.

FIG. 1 is a sectional view schematically illustrating the configuration of a semiconductor device 10 according to a first embodiment. The semiconductor device 10 includes a vertical MOS (metal-oxide-semiconductor) transistor 300 and a protective element 200. The vertical MOS transistor 300 is a GaN-based semiconductor device formed using a nitride semiconductor. According to this embodiment, the vertical MOS transistor 300 is a trench gate-type MOSFET (metal-oxide-semiconductor field effect transistor) that is used, for example, for power control and is also called power device. The protective element 200 is a PN junction diode. This embodiment employs gallium nitride (GaN) as the nitride semiconductor.

The semiconductor device 10 includes a substrate 110, an N-type semiconductor layer 120, a P-type semiconductor layer 130, an N-type semiconductor layer 140, electrodes 210, 230, 240 and 250, a wiring 270 and an insulating film 340. The semiconductor device 10 is an NPN-type semiconductor device having the stacked structure that the N-type semiconductor layer 120, the P-type semiconductor layer 130 and the N-type semiconductor layer 140 are stacked in this sequence.

The "substrate 110" is also called "semiconductor layer 110" or "first nitride semiconductor layer 110 of first conductive type". The "N-type semiconductor layer 120" is also called "second nitride semiconductor layer 120 of first conductive type". The "P-type semiconductor layer 130" is also called "third nitride semiconductor layer 130 of second conductive type". The "N-type semiconductor layer 140" is also called "fourth nitride semiconductor layer 140 of first conductive type". The "structure that the semiconductor substrate 110, the N-type semiconductor layer 120, the P-type semiconductor layer 130 and the N-type semiconductor layer 140 are stacked in this sequence" is also called "stacked body 100".

The N-type semiconductor layer 120, the P-type semiconductor layer 130 and the N-type semiconductor layer 140 of the semiconductor device 10 are semiconductor layers formed by crystal growth of metal organic chemical vapor deposition (MOCVD).

FIG. 1 illustrates XYZ axes that are orthogonal to one another. Among the XYZ axes in FIG. 1, the X axis denotes an axis along a stacking direction in which the N-type semiconductor layer 120 is stacked on the substrate 110. With regard to X-axis direction along the X axis, +X-axis direction denotes a direction from the substrate 110 toward the N-type semiconductor layer 120, and −X-axis direction denotes a direction opposite to the +X-axis direction. Among the XYZ axes in FIG. 1, the Y axis and the Z axis denote axes that are orthogonal to the X axis and are also orthogonal to each other. With regard to Y-axis direction along the Y axis, +Y-axis direction denotes a direction from left to right on the sheet surface of FIG. 1, and −Y-axis direction denotes a direction opposite to the +Y-axis direction. With regard to Z-axis direction along the Z-axis, +Z-axis direction denotes a direction from front to back on the sheet surface of FIG. 1, and −Z-axis direction denotes a direction opposite to the +Z-axis direction.

The substrate 110 of the semiconductor device 10 is an N-type semiconductor layer extended along a plane direction defined by the Y axis and the Z axis and is an N+-type semiconductor layer according to this embodiment. The substrate 110 is mainly made of a gallium (Ga)-containing nitride semiconductor. According to this embodiment, the substrate 110 is mainly made of gallium nitride (GaN). The substrate 110 contains N-type impurity such as germanium (Ge), oxygen (O) and silicon (Si) as donor. The N-type semiconductor layer 120 has a lower concentration of N-type impurity than that of the substrate 110. The expression of "mainly made of gallium nitride (GaN)" means "containing gallium nitride (GaN) at 90% or a higher molar fraction.

The substrate 110 has a convex 115 that is protruded toward the N-type semiconductor layer 120. A side face (Y-axis direction side face) of the convex 115 is provided as a-face or m-face, and a top face (+X-axis direction side face) of the convex 115 is provided as c-face. The advantageous effects achieved by providing the convex 115 will be described later. According to a modified configuration, an N+-type semiconductor layer may be provided in place of the substrate 110, and a substrate may be placed between the electrode 210 and the N+-type semiconductor layer.

The N-type semiconductor layer 120 of the semiconductor device 10 is a semiconductor layer that is stacked on the +X-axis direction side of the substrate 110 and is extended along the plane direction defined by the Y axis and the Z axis. The N-type semiconductor layer 120 is mainly made of a gallium (Ga)-containing nitride semiconductor. According to this embodiment, the N-type semiconductor layer 120 is mainly made of gallium nitride (GaN). The N-type semiconductor layer 120 contains silicon (Si) as donor. The N-type semiconductor layer 120 is also called "n--GaN".

The P-type semiconductor layer 130 of the semiconductor device 10 is a semiconductor layer that is stacked on the +X-axis direction side of the N-type semiconductor layer 120 and is extended along the plane direction defined by the Y axis and the Z axis. The P-type semiconductor layer 130 is mainly made of a gallium (Ga)-containing nitride semiconductor. According to this embodiment, the P-type semiconductor layer 130 is mainly made of gallium nitride (GaN). The P-type semiconductor layer 130 contains magnesium (Mg) as P-type impurity. The impurity concentration of the P-type semiconductor layer 130 is higher than the impurity concentration of the N-type semiconductor layer 120. The P-type semiconductor layer 130 is also called "p-GaN".

The N-type semiconductor layer 140 of the semiconductor device 10 is a semiconductor layer that is stacked on the +X-axis direction side of the P-type semiconductor layer 130 and is extended along the plane direction defined by the Y axis and the Z axis. The N-type semiconductor layer 140 is mainly made of gallium nitride (GaN). The N-type semiconductor layer 140 contains silicon (Si) as N-type impurity. The impurity concentration of the N-type semiconductor layer 140 is higher than the impurity concentration of the N-type semiconductor layer 120. The N-type semiconductor layer 140 is also called "n+-GaN". The substrate 110, the N-type semiconductor layer 120, the P-type semiconductor layer 130 and the N-type semiconductor layer 140 are made of the gallium-containing nitride semiconductor.

The semiconductor device 10 also has a recess 182 that denotes a portion where the P-type semiconductor layer 130 is exposed on the +X-axis direction side. The recess 182 is also called concave.

The semiconductor 10 also includes trenches 184 that are formed by dry etching. The trench 184 denotes a portion formed from the +X-axis direction side of the N-type semiconductor layer 140 to penetrate through the P-type semiconductor layer 130 and the N-type semiconductor layer 140 and reach the N-type semiconductor layer 120. According to this embodiment, the trenches 184 are located on the +Y-axis direction side of the recess 182.

The insulating film 340 is formed on the surface of the trenches 184 over to the +X-axis direction side of the stacked body 100. According to this embodiment, the insulating film 340 is made of silicon dioxide ($SiO_2$). Silicon dioxide ($SiO_2$) is, however, not essential and may be replaced by aluminum oxide ($Al_2O_3$), zirconium oxide ($ZrO_2$) or tantalum oxide ($Ta_2O_3$).

The semiconductor device 10 also has a step 186 that is formed by dry etching. The step 186 is a portion formed to penetrate through the P-type semiconductor layer 130 and reach the N-type semiconductor layer 120. The step 186 is an element isolation area provided to isolate the semiconductor element. In the view from the stacking direction of the stacked body 100 (X-axis direction), the step 186 is located on the side opposite to the side where the trenches 184 are located, across the convex 115. In other words, the step 186 is located on the −Y-axis direction side of the trenches 184.

The electrode 210 of the semiconductor device 10 is a drain electrode formed to be in contact with a surface of the substrate 110 that is opposite to the surface in contact with the N-type semiconductor layer 120. In other words, the electrode 210 is formed on the −X-axis direction side of the substrate 110. The electrode 210 is an N-type ohmic electrode. According to this embodiment, the electrode 210 is formed by stacking a layer made of aluminum (Al) on a layer made of titanium (Ti) and heating the stacked layers. The "electrode 210" is also called "first electrode 210".

The electrode 230 of the semiconductor device 10 is a body electrode formed on the P-type semiconductor layer 130 that is exposed inside of the recess 182. The electrode 230 is a P-type ohmic electrode that is formed to be in contact with a surface of the P-type semiconductor layer 130 that is opposite to the surface in contact with the N-type semiconductor layer 120. The "electrode 230" is also called "ohmic electrode 230 of second conductive type". According to this embodiment, the electrode 230 is formed by stacking a layer made of palladium (Pd) and heating the stacked layer.

The electrode 240 of the semiconductor device 10 is a source electrode formed on the N-type semiconductor layer 140 (+X-axis direction side) to be located between the recess 182 and the trenches 184. The electrode 240 is an N-type ohmic electrode formed to be in contact with a surface of the N-type semiconductor layer 140 that is opposite to the surface in contact with the P-type semiconductor layer 130. According to this embodiment, the electrode 240 is formed by stacking a layer made of aluminum (Al) on a layer made of titanium (Ti) and heating the stacked layers. The electrode 240 is provided as an ohmic electrode and serves to reduce the ON resistance of the vertical MOS transistor 300.

The electrodes 250 of the semiconductor device 10 are gate electrodes formed on the insulating layer 340 in the trenches 184. According to this embodiment, the electrodes 250 are made of aluminum (Al). Aluminum (Al) is, however, not essential but may be replaced by aluminum silicon (AlSi) or aluminum silicon copper (AlSiCu).

The wiring 270 of the semiconductor device 10 is provided as a wiring to electrically connect the electrode 230 with the electrode 240. The "wiring 270" is also called "first wiring 270" and is made of aluminum (Al). Aluminum (Al) is, however, not essential but may be replaced by aluminum silicon (AlSi) or aluminum silicon copper (AlSiCu). The wiring 270 is arranged to cover a side face (Y-axis direction side face) of the step 186 via the insulating film 340. The wiring 270 suppresses the potential crowding on the side face of the step 186 and accordingly suppresses breakdown of the semiconductor device 10.

The vertical MOS transistor 300 is formed from the stacked body 100, the electrode 210 as the drain electrode, the electrodes 250 as gate electrodes and the electrode 240 as the source electrode. The protective element 200 is formed from the stacked body 100, the electrode 230 and the electrode 210. The protective element 200 is a PN junction diode provided to protect the vertical MOS transistor 300 from breakdown. Herein "breakdown" denotes a state that inside of the vertical MOS transistor is broken down by application of a voltage that is equal to or higher than a breakdown voltage and thereby fails to provide the original current-voltage characteristics.

Figure 2:
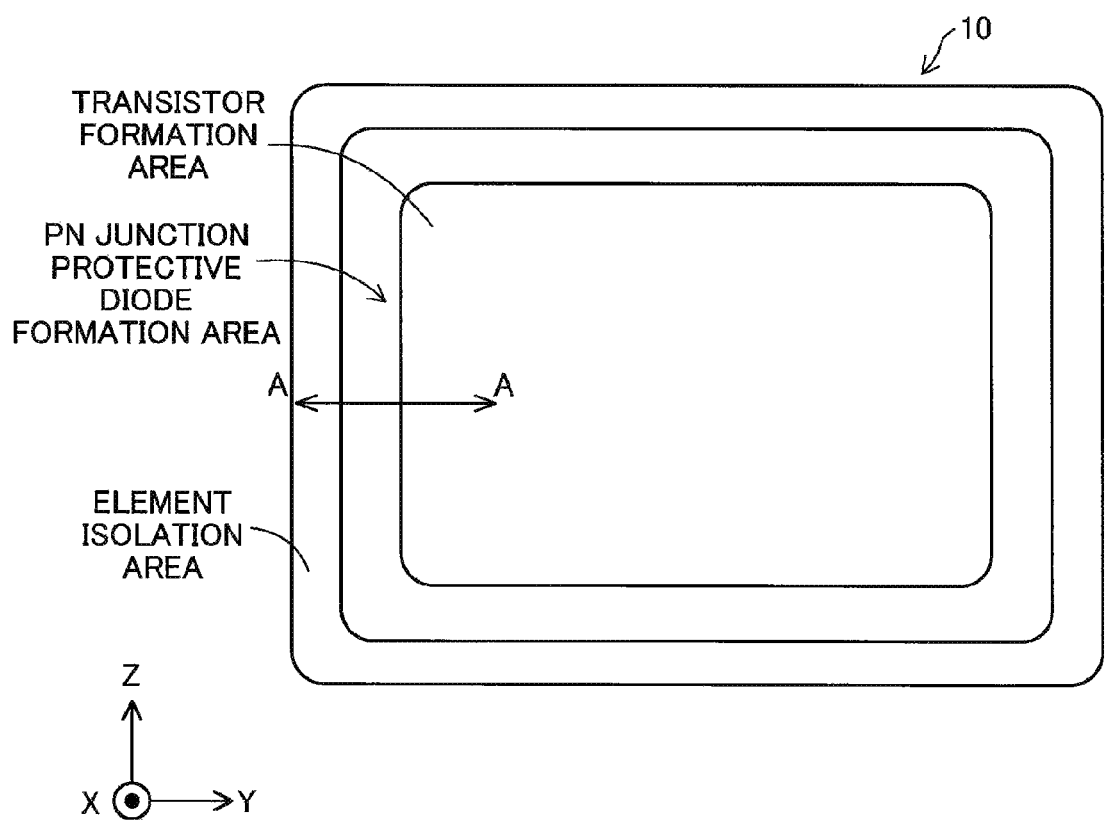
FIG. 2 is an appearance diagram illustrating the semiconductor device, viewed from a +X-axis direction side.

FIG. 2 is an appearance diagram illustrating the semiconductor device 10, viewed from the +X-axis direction side. The A-A section in FIG. 2 corresponds to the A-A section in FIG. 1. The semiconductor device 10 includes (i) an element isolation area used for isolation of the semiconductor element; (ii) a PN junction protective diode formation area where the protective element 200 is formed; and (iii) a transistor formation area where the vertical MOS transistor 300 is formed, which are arranged sequentially from the −Y-axis direction side.

Figure 3:
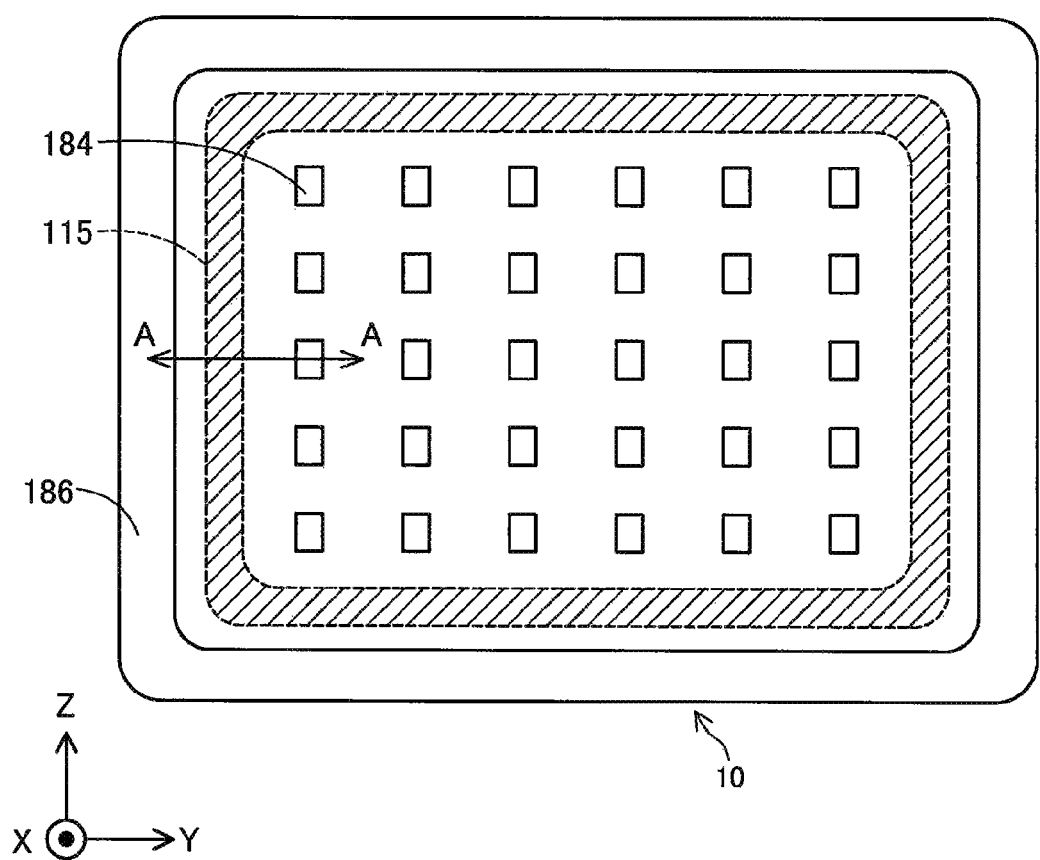
FIG. 3 is a schematic view illustrating an interface between an N-type semiconductor layer and a P-type semiconductor layer, viewed from the +X-axis direction side.

FIG. 3 is a schematic view illustrating an interface between the N-type semiconductor layer 120 and the P-type semiconductor layer 130, viewed from the +X-axis direction side. Like FIG. 2, the A-A section in FIG. 3 corresponds to the A-A section in FIG. 1. As understood from the illustration, the convex 115 is located on the inner circumferential side of the step 186, and a plurality of trenches 184 are arranged on the inner circumferential side of the convex 115.

Figure 4:
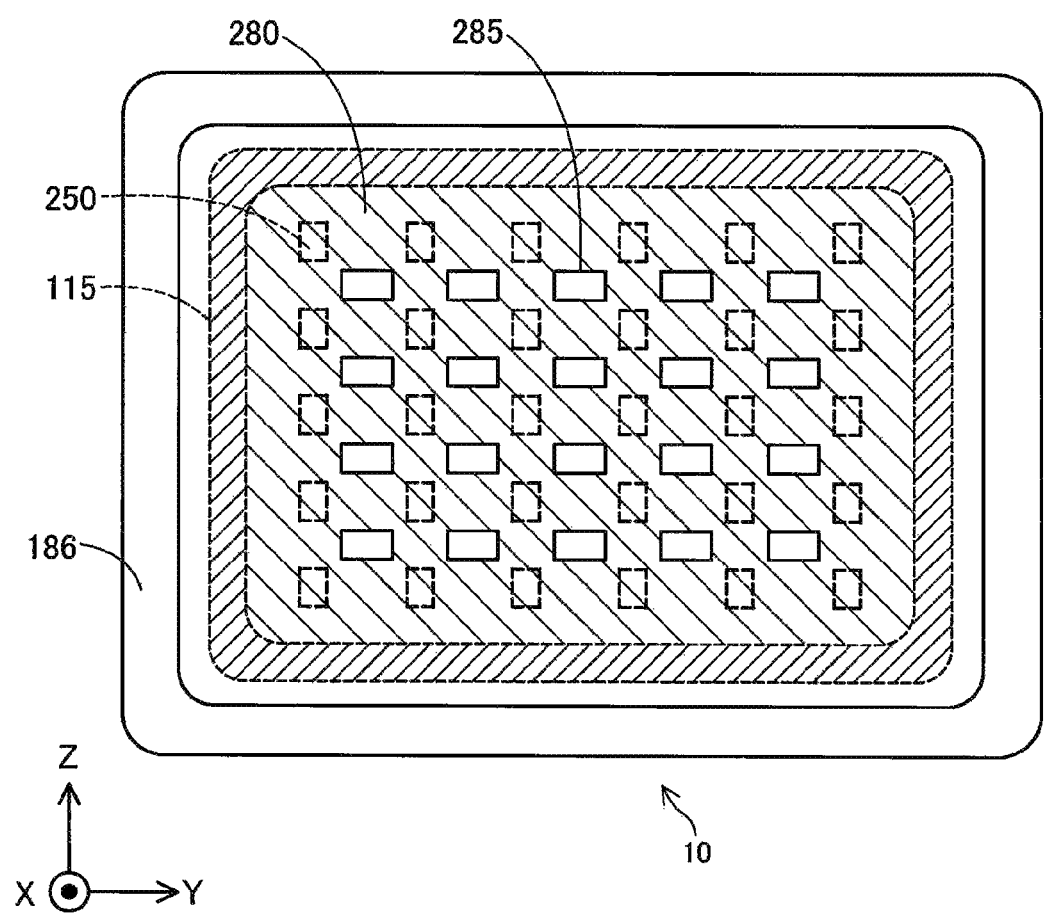
FIG. 4 is an appearance diagram illustrating the semiconductor device, viewed from the +X-axis direction side, in the state that a plurality of electrodes provided in the semiconductor device are electrically connected by a wiring.

FIG. 4 is an appearance diagram illustrating the semiconductor device 10, viewed from the +X-axis direction side, in the state that a plurality of electrodes 250 provided in the semiconductor device 10 are electrically connected by a wiring 280. In order to facilitate understanding, the location of the convex 115 is shown by the broken line and slant lines in FIG. 4. The wiring 280 is arranged to linearly connect adjacent electrodes 250 with each other. The electrodes 250 are formed below the wiring 280, and the surface of the electrodes 250 is covered by the wiring 280. The positions of the electrodes 250 are thus shown by the broken lines in FIG. 4. Openings 285 are formed in part of the wiring 280. The openings 285 are areas provided to draw out a wiring (not shown) connected with the electrode 240. According to this embodiment, the wiring 280 is made of aluminum (Al). Aluminum (Al) is, however, not essential but may be replaced by aluminum silicon (AlSi) or aluminum silicon copper (AlSiCu).

As shown in FIG. 1, the top face of the convex 115 is placed at a position to overlap with at least part of the electrode 230, when viewed from the stacking direction of the stacked body 100 (X-axis direction). A thickness d2 of the N-type semiconductor layer 120 in a portion which a bottom face (−X-axis direction side face) of the trench 184 is in contact with is greater than a thickness d5 of the N-type semiconductor layer 120 in a portion which the top face (+X-axis direction side face) of the convex 115 is in contact with. This configuration causes a larger amount of electric current to flow from the electrode 230 to the electrode 210 rather than flow from the electrodes 250 to the electrode 210 in the case where a higher drain voltage than the breakdown voltage of the protective element 200 is applied to the vertical MOS transistor 300. The protective element 200 causes the voltage between the electrode 230 and the electrode 210 to be equal to the breakdown voltage of the protective element 200 and thereby causes the voltage between the electrode 240 and the electrode 210 to be also equal to the breakdown voltage of the protective element 200. This prevents breakdown of the vertical MOS transistor 300. The protective element 200 can thus protect the vertical MOS transistor 300.

The following describes the functions and the advantageous effects of the embodiment. There is a need to design the protective element 200 such as to have a lower breakdown voltage than that of the vertical MOS transistor 300, in order to be protected from breakdown. The thickness d5 of the protective element 200 is thus required to be smaller than the thickness d2 of the vertical MOS transistor 300. A method employable to make the thickness d5 smaller than the thickness d2 may remove part of the +X-axis direction side of the N-type semiconductor layer 120 and subsequently regrow a P-type semiconductor layer in the removed part. As the result of examination, the inventors have, however, found that this method causes an unintended N-type carrier to be generated at a regrowth interface and reduces the breakdown voltage of the PN junction diode. In the semiconductor device 10 of this embodiment, on the other hand, the thickness d5 is made smaller than the thickness d2 by forming the convex 115. The N-type semiconductor layer 120 is formed on the substrate 110 that is provided with the convex 115. Even in the case where an unintended N-type carrier is generated at an interface between the substrate 110 and the N-type semiconductor layer 120, the N-type carrier placed between the N-type layers (110 and 120) does not significantly reduce the breakdown voltage of the protective element 200. Another method employable to make the thickness d5 smaller than the thickness d2 is a method using P-type ion implantation. In an application that uses a nitride semiconductor as the semiconductor, however, there is a difficulty in P-type ion implantation. The embodiment can, however, readily make the thickness d5 smaller than the thickness d2 by simply forming the convex 115 without P-type ion implantation.

The N-type semiconductor layer 140 is placed at a position that does not overlap with the top face of the convex 115, when viewed from the stacking direction (X-axis direction). This configuration causes the drain current of the vertical MOS transistor 300 to flow between the N-type semiconductor layer 140 and the substrate 110 below the trenches 184. The breakdown voltage of the vertical MOS transistor 300 is accordingly not reduced by the presence of the convex 115. This configuration prevents the breakdown voltage of the vertical MOS transistor 300 from becoming lower than the breakdown voltage of the protective element 200 and results in suppressing breakdown of the vertical MOS transistor 300.

The thickness d5 of the N-type semiconductor layer 120 in the portion which the top face of the convex 115 is in contact with is not greater than a thickness d4 of the N-type semiconductor layer 120 in a portion which a bottom face (−X-axis direction side face) of the step 186 is in contact with. This configuration causes the electric current to flow in the protective element 200, before flowing between the step 186 and the electrode 210. This results in suppressing breakdown of the semiconductor device 10.

A distance d3 between the bottom face of the step 186 and the convex 115 is greater than the thickness d4 of the N-type semiconductor layer 120 in the portion which the bottom face (−X-axis direction side face) of the step 186 is in contact with. This configuration causes the electric current to flow in the protective element 200, before flowing between the step 186 and the electrode 210 across the step 186. This results in suppressing breakdown of the semiconductor device 10.

A distance d1 between the top face of the convex 115 and the bottom face of the trench 184 is greater than the thickness d2 of the N-type semiconductor layer 120 in the portion which the bottom face of the trench 184 is in contact with. In the case where a voltage equal to or greater than the breakdown voltage of the protective element 200 is applied between the electrode 210 and the wiring 270, this configuration causes the electric current to flow in the protective element 200, before flowing from the electrode 210 across the convex 115 to the trench 184. This results in suppressing breakdown of the semiconductor device 10.

Figure 5A:
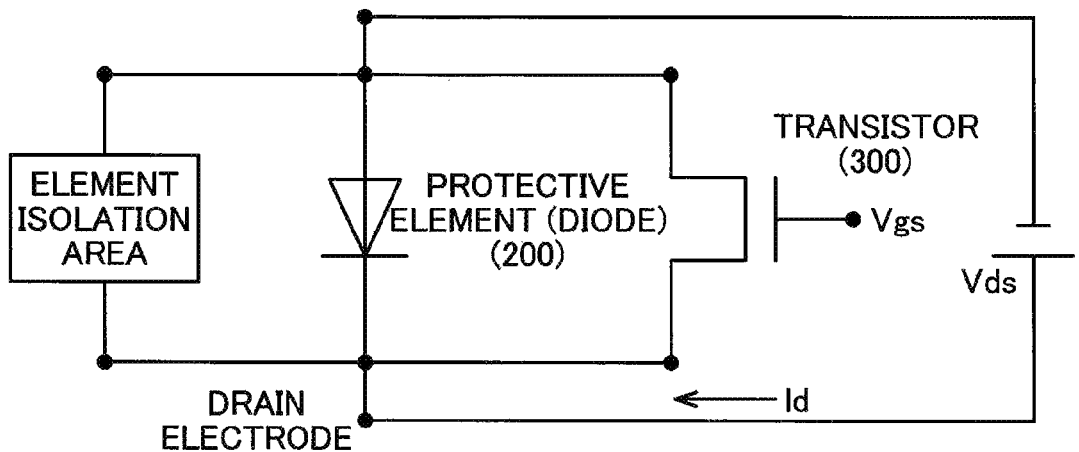
FIG. 5A is a diagram illustrating the advantageous effects of the semiconductor device of the embodiment.
Figure 5B:
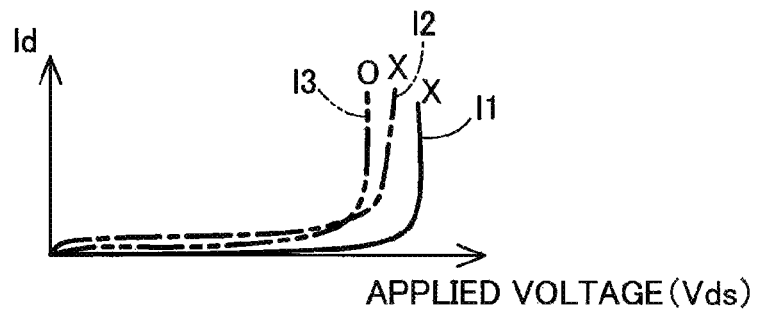
FIG. 5B is a diagram illustrating the advantageous effects of the semiconductor device of the embodiment.
Figure 5C:
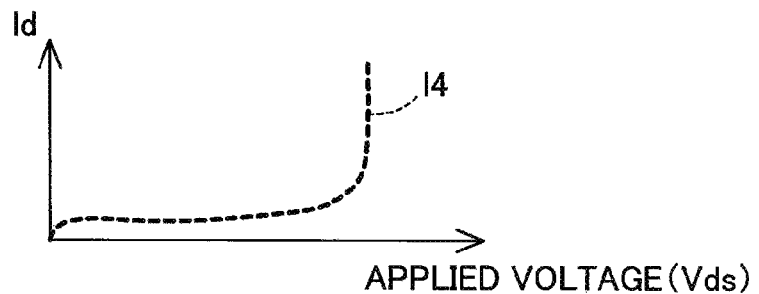
FIG. 5C is a diagram illustrating the advantageous effects of the semiconductor device of the embodiment.

FIGS. 5A to 5C are diagrams illustrating the advantageous effects of the semiconductor device 10 of the embodiment. FIG. 5A illustrates an equivalent circuit of this embodiment. According to this embodiment, the protective element 200, the vertical MOS transistor 300 and the element isolation area are connected in parallel. A voltage Vds denotes voltage between the drain electrode (electrode 210) and the source electrode (electrode 240) of the vertical MOS transistor 300, a voltage Vgs denotes voltage between the gate electrode (electrode 250) and the source electrode (electrode 240), and an electric current Id denotes drain current.

FIG. 5B shows the current-voltage characteristics. A one-dot chain line curve I2 shows the behavior of electric current Id when the voltage Vds is applied between the drain electrode and the source electrode in a configuration including only the vertical MOS transistor 300 without the protective element 200 and the element isolation area. The voltage Vgs between the gate electrode and the source electrode is 0 V. In the configuration including only the vertical MOS transistor 300, breakdown of the semiconductor device occurs at a point X on the one-dot chain line curve I2. The breakdown is irreversible. Once the breakdown occurs, the leak current significantly increases, and the device characteristic is not returned to the original device characteristic but is deteriorated.

A solid line curve I1 shows the behavior of electric current Id when the voltage Vds is applied in a configuration including only the element isolation area. Breakdown of the semiconductor device occurs at a point X on the solid line curve I1.

A two-dot chain line curve I3 shows the behavior of electric current Id when the voltage Vds is applied in a configuration including only the protective element 200. The electric current abruptly increases by Avalanche breakdown at a point O on the two-dot chain line curve I3. This suppresses further application of the voltage. The result of the two-dot chain line curve I3 shows that the protective element 200 serves as a constant voltage diode. A PN junction interface of the protective element 200 is formed by a uniform flat plane, so that a uniform electric field is applied to the PN junction interface. This protects the PN junction interface from being damaged by Avalanche breakdown and does not cause breakdown of the semiconductor device. Accordingly, even when the voltage Vds is applied at the point O on the two-dot chain line curve I3, the irreversible breakdown does not occur in the protective element 200. When the voltage applied is lower than the voltage Vds at the point O, the electric current flows along the two-dot chain line curve I3 and the leak current is not superposed. According to this embodiment, the junction of the protective element 200 is not Schottky junction but PN junction. This is attributed to that application of a high voltage to Schottky junction is likely to cause breakdown at an interface between metal and semiconductor and thereby irreversibly increases the leak current.

A broken-line curve I4 in FIG. 5C shows the behavior of electric current Id when the voltage Vds is applied to the entire semiconductor device 10 of the embodiment. As shown in FIG. 5A, the protective element 200, the vertical MOS transistor 300 and the element isolation area are connected in parallel.

As shown by the broken-line curve I4 in FIG. 5C, the semiconductor device 10 includes the protective element 200, so that the voltage Vds does not exceed the voltage determined according to the characteristic of the protective element 200. In other words, the voltage applied to the element isolation area and the voltage applied between the drain electrode and the source electrode of the vertical MOS transistor 300 are lower than the voltages that cause breakdown of the element isolation area and the vertical MOS transistor 300. For example, it is assumed that a higher voltage such as to cause breakdown of the element isolation area or the vertical MOS transistor 300 is applied from outside of the semiconductor device 10 to the semiconductor device 10 of the embodiment. Even in this case, since the semiconductor device 10 includes the protective element 200, the voltage applied to the element isolation area or the vertical MOS transistor 300 is reduced to the voltage that causes Avalanche breakdown of the protective element 200. This suppresses breakdown of the semiconductor device 10.

Figure 6:
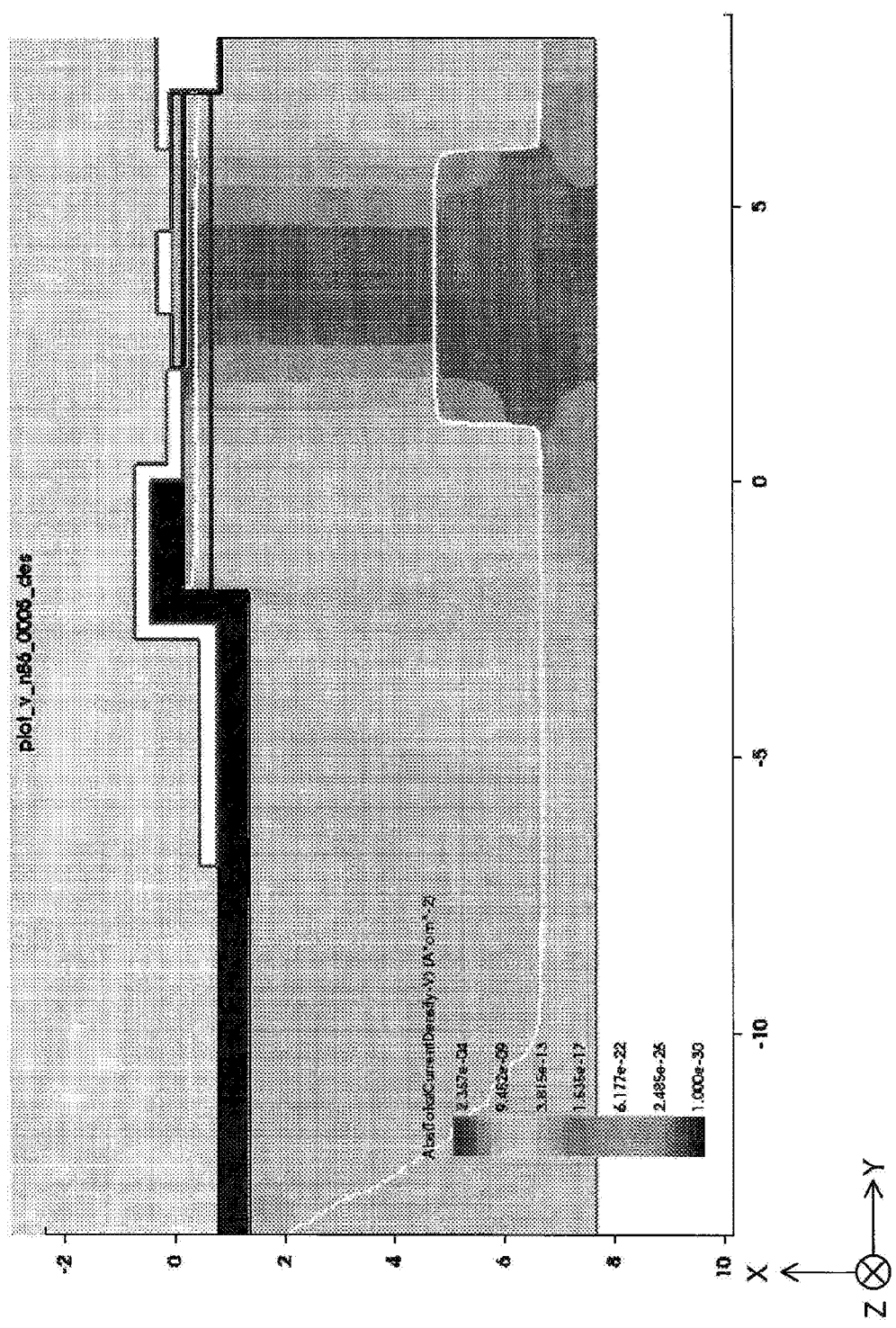
FIG. 6 is a diagram illustrating an electric current distribution of the semiconductor device calculated by TCAD (technology CAD) simulator.

FIG. 6 is a diagram illustrating an electric current distribution of the semiconductor device 10 calculated by TCAD (technology CAD) simulator. A left half of a gate trench is shown on the right upper side of the diagram. The current density distribution of FIG. 6 shows the distribution when the voltage Vds between the drain electrode (electrode 210) and the source electrode (electrode 240) was 1200 V and the voltage Vgs between the gate electrode (electrode 250) and the source electrode (electrode 240) was 0 V. The thickness in the stacking direction (X-axis direction) of the convex 115 was 2 µm, and the thickness in the width direction (Y-axis direction) of the convex 115 was 5 µm. A thickness d6 (shown in FIG. 1) of the N-type semiconductor layer 120 other than the convex 115 was 6 µm. The thickness d4 in the portion which the bottom face of the step 186 is in contact with was 5 µm.

As shown in FIG. 6, the electric current flows upward (in the +X-axis direction) from the top face of the convex 115 by impact ionization at the voltage Vds of 1200 V. As shown in FIG. 6, the vertical MOS transistor 300 and the element isolation area have low current densities (thinner colored portions), which suggest no flow of electric current by impact ionization. This result indicates suppressing breakdown of the semiconductor device 10.

A2. Method for Manufacturing Semiconductor Device 10

Figure 7:
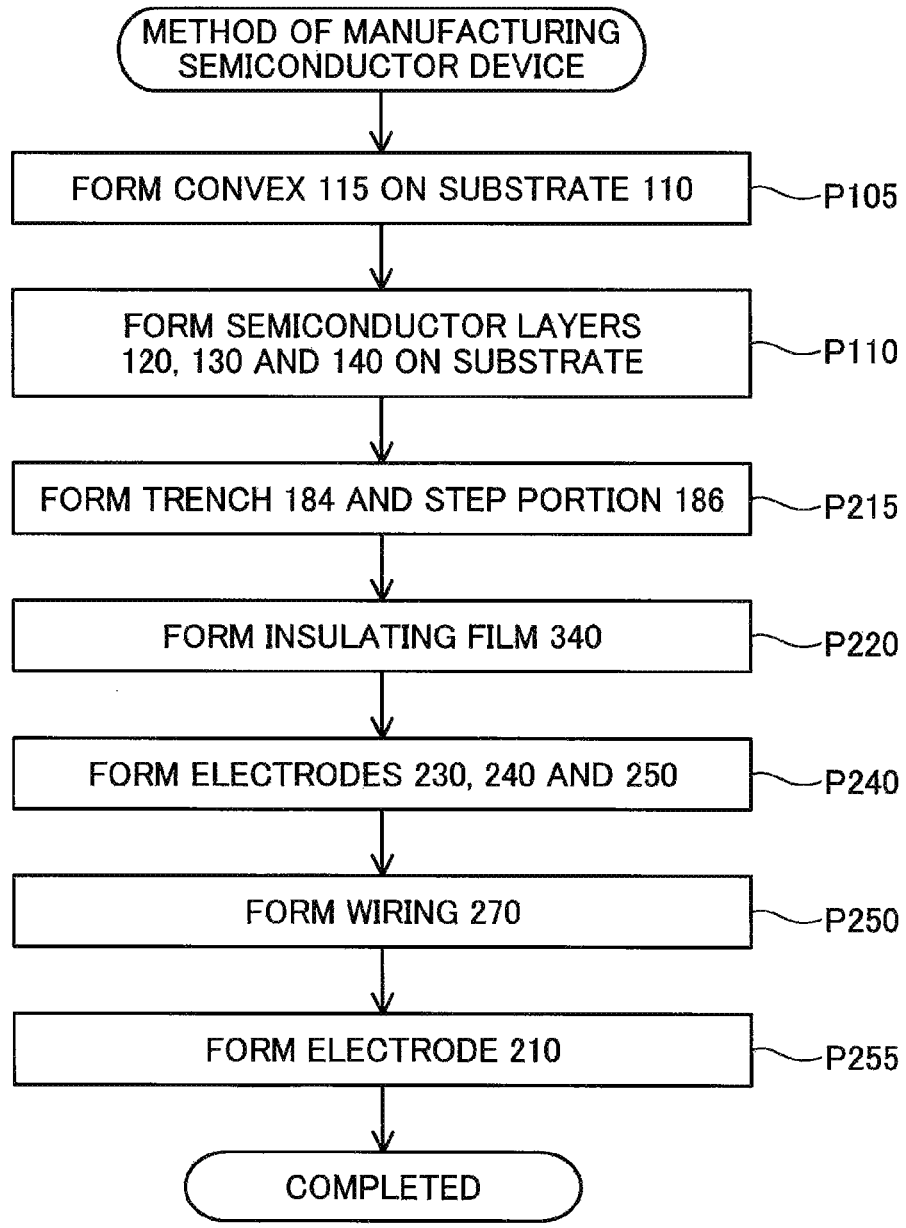
FIG. 7 is a process chart showing a method for manufacturing the semiconductor device.

FIG. 7 is a process chart showing a method for manufacturing the semiconductor device 10. The convex 115 is first formed to be protruded on the surface of the substrate 110 at process P105.

Figure 8A:
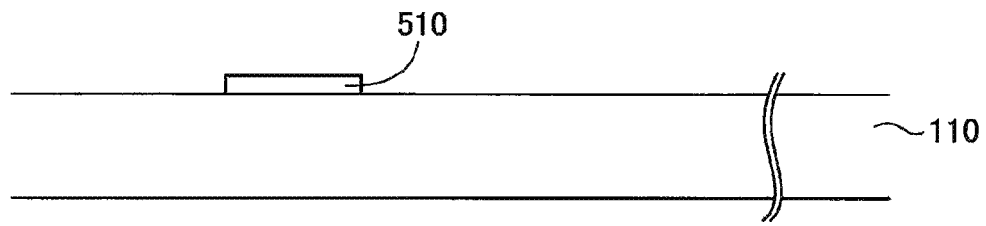
FIG. 8A is a sectional view illustrating intermediate products of the semiconductor device at process P105.
Figure 8B:
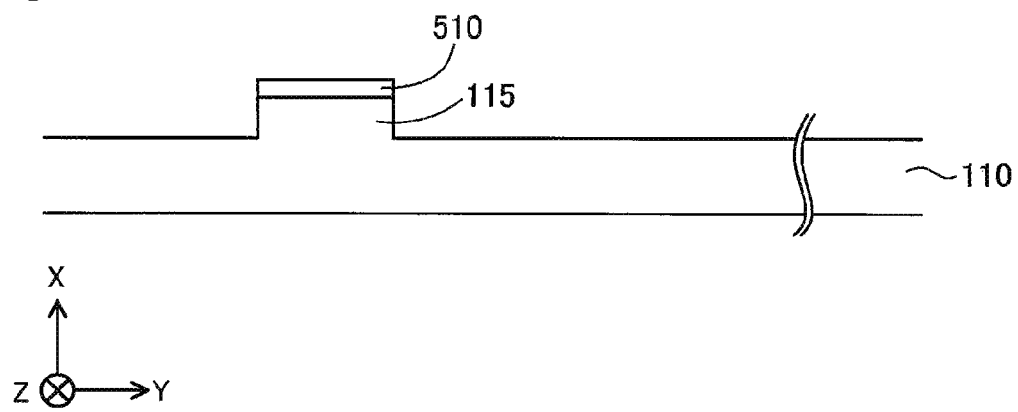
FIG. 8B is a sectional view illustrating intermediate products of the semiconductor device at process P105.

FIGS. 8A and 8B are sectional views illustrating intermediate products of the semiconductor device 10 at process P105. According to this embodiment, at process P105, the manufacturer first forms an insulating film of silicon dioxide ($SiO_2$) on the substrate 110 by a plasma CVD (chemical vapor deposition) apparatus. The manufacturer subsequently soaks the substrate 110 with the insulating film in buffered hydrofluoric acid (BHF) using a resist patterned by lithography as a mask to etch the insulating film. The manufacturer subsequently soaks this intermediate product of the semiconductor device 10 in a stripping solution to remove the resist pattern. FIG. 8A illustrates an intermediate product of the semiconductor device 10 with an insulating film 510 formed on the substrate 110.

The manufacturer then dry-etches the substrate 110 by about 2 μm by an inductively coupled plasma (ICP)-based dry etching apparatus. FIG. 8B illustrates an intermediate product of the semiconductor device 10 after dry etching. The manufacturer then soaks the insulating film in buffered hydrofluoric acid to remove the insulating film. This provides the convex 115 formed to be protruded on the surface of the substrate 110.

At process P110 (shown in FIG. 7), the N-type semiconductor layer 120, the P-type semiconductor layer 130 and the N-type semiconductor layer 140 are stacked in this sequence on the substrate 110. According to this embodiment, the manufacturer places the substrate 110 in an MOCVD furnace to heat the substrate 110 to a temperature that causes growth of the N-type semiconductor layer 120 (for example, 1050° C.). The inside of the MOCVD furnace is kept in an atmosphere of hydrogen ($H_2$) as the carrier gas and ammonia ($NH_3$) as the group V element. The manufacturer then introduces trimethylgallium (TMGa) as the group III material and silane ($SiH_4$) as the N-type impurity to induce growth of the N-type semiconductor layer 120 having the donor concentration of about $1\times10^{16}$ $cm^{-3}$ by about 6 μm. The donor concentration is preferably $1\times10^{15}$ $cm^{-3}$ to $1\times10^{16}$ $cm^{-3}$, and the thickness of the N-type semiconductor layer 120 is preferably 5 μm to 20 μm.

The manufacturer subsequently introduces trimethylgallium (TMGa) as the group III material and bis(cyclopentadienyl)magnesium (Cp2Mg) as the P-type impurity into the furnace to induce growth of the P-type semiconductor layer 130 having the magnesium (Mg) concentration of about $4\times10^{18}$ $cm^{-3}$ by about 0.7 μm. The magnesium (Mg) concentration is preferably not lower than $1\times10^{18}$ $cm^{-3}$, and the thickness of the P-type semiconductor layer 130 is preferably 0.5 μm to 2 μm.

According to this embodiment, the manufacturer then introduces trimethylgallium (TMGa) as the group III material and silane ($SiH_4$) as the N-type impurity to induce growth of the N-type semiconductor layer 140 having the donor concentration of about $1\times10^{18}$ $cm^{-3}$ by about 0.2 μm.

Figure 9:
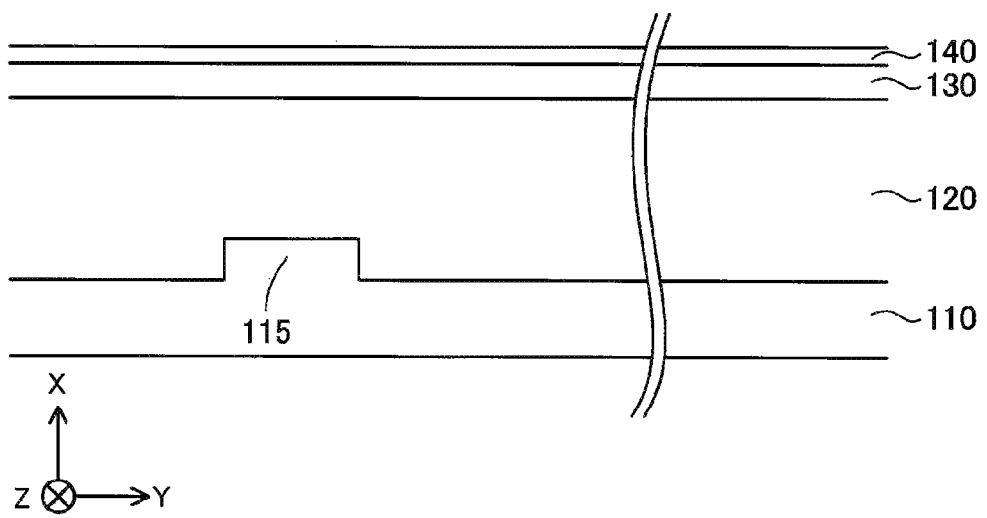
FIG. 9 is a sectional view illustrating an intermediate product of the semiconductor device with semiconductor layers formed on a substrate.

FIG. 9 is a sectional view illustrating an intermediate product of the semiconductor device 10 with the semiconductor layers (120, 130 and 140) formed on the substrate 110 at process P110 described above. The regrowth interface herein is an interface between the substrate 110 and the N-type semiconductor layer 120. In the case where the regrowth interface is an interface between the N-type semiconductor layer 120 and the P-type semiconductor layer 130 (PN junction interface), the breakdown voltage of the protective element 200 is likely to be decreased. The regrowth interface of the semiconductor device 10 is, however, the interface between the N-type substrate 110 and the N-type semiconductor layer 120 (N/N interface). This suppresses decrease in the breakdown voltage of the protective element 200.

After process P110, at process P215 (shown in FIG. 7), the trenches 184 and the step 186 are formed in the intermediate product of the semiconductor device 10. The manufacturer first stacks an insulating film as a mask and performs patterning using a photoresist. The manufacturer subsequently performs etching to form the trenches 184 and the step 186.

Figure 10:
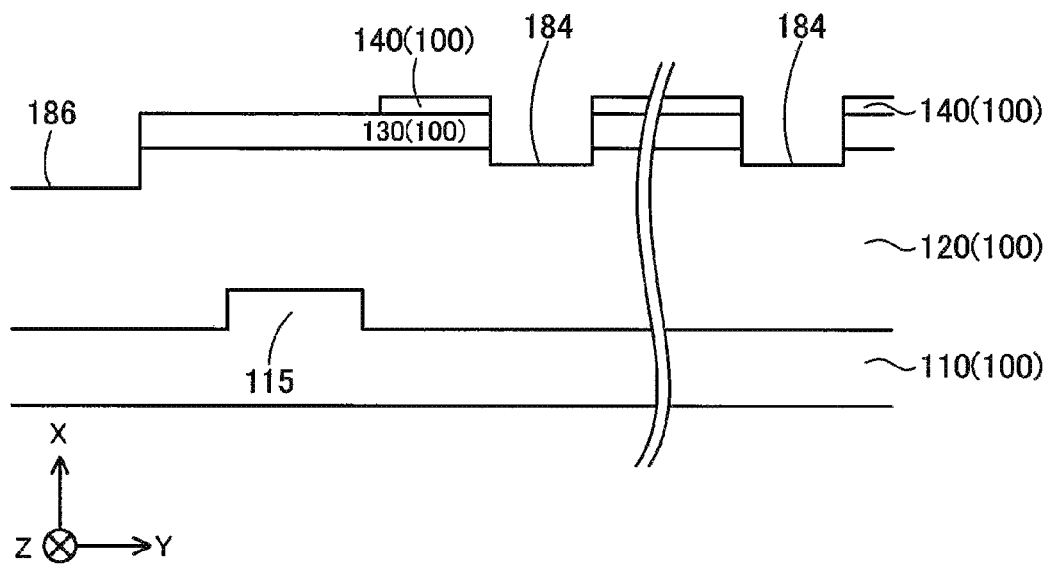
FIG. 10 is a sectional view illustrating an intermediate product of the semiconductor device with trenches and a step formed therein.

FIG. 10 is a sectional view illustrating an intermediate product of the semiconductor device 10 with the trenches 184 and the step 186 formed therein. This embodiment employs dry etching as the etching technique. A modified procedure may perform wet dry etching subsequent to dry etching, for the purpose of removing a layer damaged by etching.

At subsequent process P220 (shown in FIG. 7), the insulating film 340 is formed. The manufacturer first stacks an insulating film as a mask and performs patterning using a photoresist.

Figure 11:
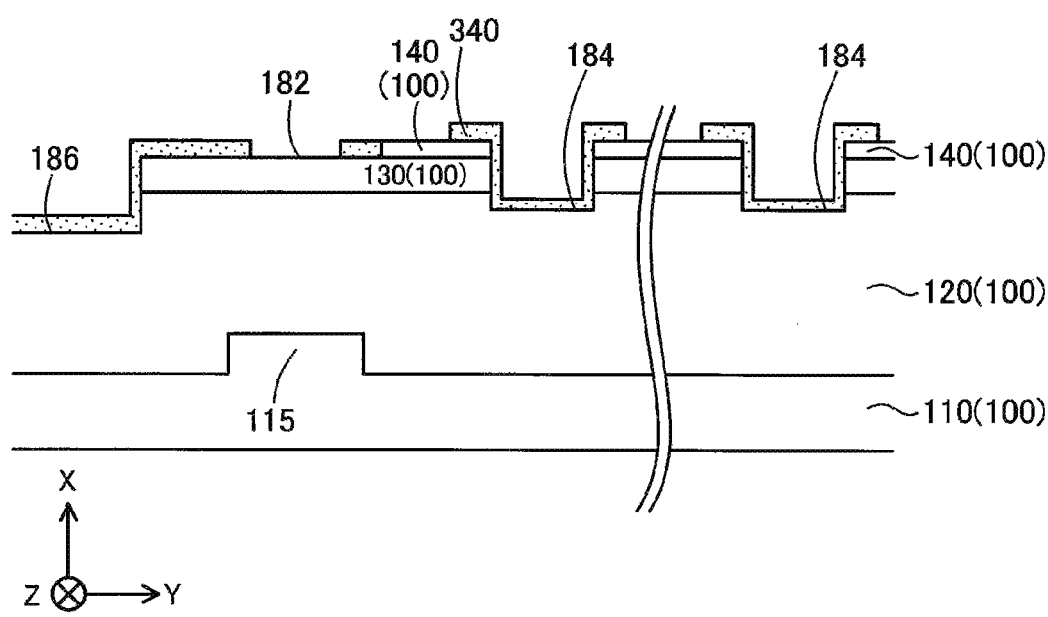
FIG. 11 is a sectional view illustrating an intermediate product of the semiconductor device with an insulating film formed therein.

FIG. 11 is a sectional view illustrating an intermediate product of the semiconductor device 10 with the insulating film 340 formed therein. At process P220, after formation of the insulating film 340, part of the insulating film 340 is removed by dry etching using the patterned resist as the mask to form the recess 182.

At process P240 (shown in FIG. 7), the manufacturer forms the electrodes 230, 240 and 250 by the lift-off method.

Figure 12:
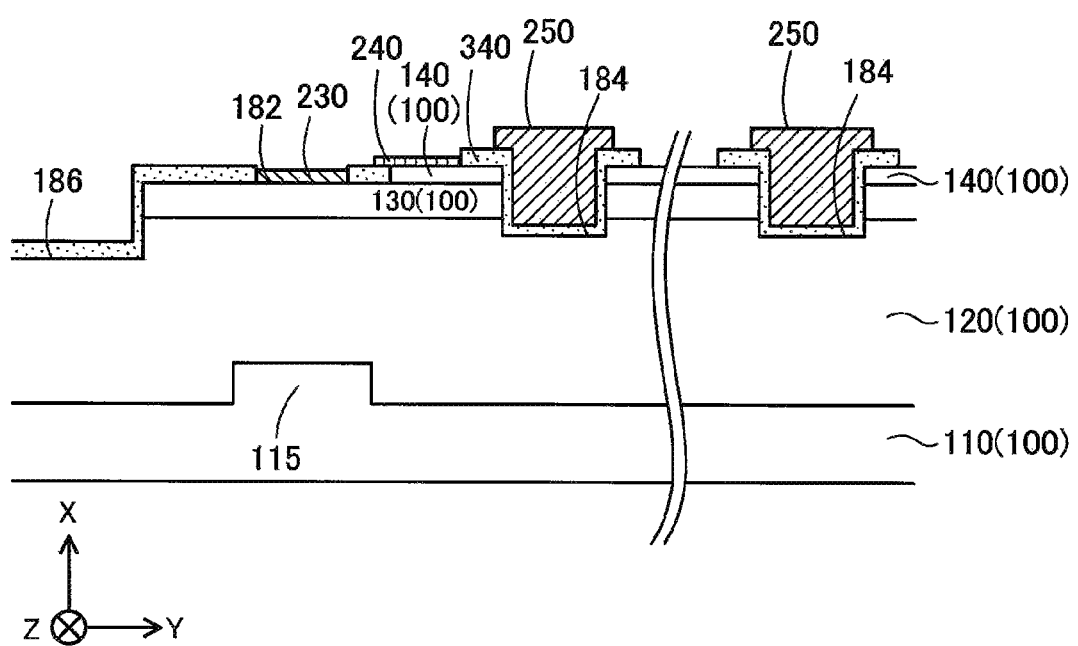
FIG. 12 is a sectional view illustrating an intermediate product of the semiconductor device with electrodes formed therein.

FIG. 12 is a sectional view illustrating an intermediate product of the semiconductor device 10 with the electrodes 230, 240 and 250 formed therein.

At subsequent process P250 (shown in FIG. 7), the manufacturer forms the wiring 270 to electrically connect the electrode 230 with the electrode 240. The manufacturer then forms the electrode 210 on the −X-axis direction side of the intermediate product of the semiconductor device 10 at process P255. The semiconductor device 10 shown in FIG. 1 is completed by the series of processes described above.

B. Second Embodiment

Figure 13:
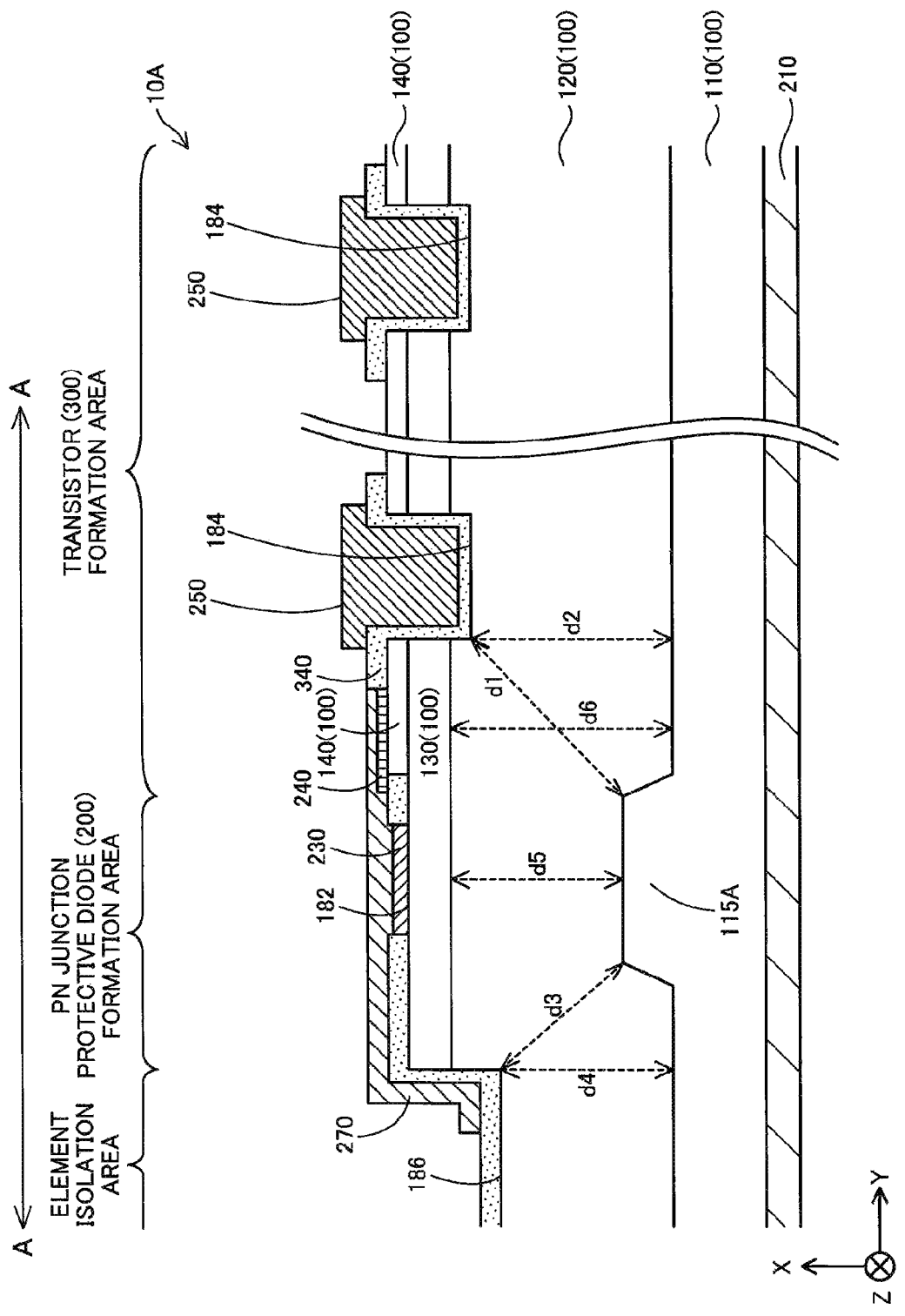
FIG. 13 is a diagram schematically illustrating the configuration of a semiconductor device according to a second embodiment.

FIG. 13 is a diagram schematically illustrating the configuration of a semiconductor device 10A according to a second embodiment. The semiconductor device 10A differs from the semiconductor device 10 by the shape of a convex but otherwise has similar configuration to that of the semiconductor device 10. In the semiconductor device 10A, a side face (Y-axis direction side face) of a convex 115A is inclined relative to a top face (+X-axis direction side face) of the convex 115A. According to this embodiment, the side face (Y-axis direction side face) of the convex 115A of the semiconductor device 10A is tapered. A method for manufacturing the semiconductor device 10A differs from the method for manufacturing the semiconductor device 10 by the process of forming the convex 115A (process P105) but is otherwise similar to the method for manufacturing the semiconductor device 10.

FIGS. 14A and 14B are diagrams illustrating the process of forming the convex 115A. The manufacturer first forms an insulating film 510A having a side face inclined relative to a top face. FIG. 14A illustrates an intermediate product of the semiconductor device 10A with the insulating film 510A formed on the substrate 110. The manufacturer subsequently etches the semiconductor substrate 110 by anisotropic dry etching to form the convex 115A. FIG. 14B illustrates an intermediate product of the semiconductor device 10A with the convex 115A formed therein. Forming the convex in the shape that has the side face inclined to the top face provides the advantageous effect of suppressing decrease in the breakdown voltage of the protective element.

C. Modifications

The invention is not limited to any of the embodiments described above but may be implemented by a diversity of other aspects without departing from the scope of the invention. Some of possible modifications are given below.

C1. Modification 1

The convex 115 is formed by etching according to the above embodiment, but the invention is not limited to this method. The convex 115 may be formed by regrowth method.

FIGS. 15A and 15B are diagrams illustrating a process of forming a convex 115B by regrowth. The manufacturer first forms an insulating film 510B such that the substrate 110 is exposed in a portion where the convex 115B is to be formed. FIG. 15A is a sectional view illustrating an intermediate product of a semiconductor device with the insulating film 510B formed therein. The manufacturer then induces regrowth of the semiconductor layer 110 by the MOCVD method. FIG. 15B is a sectional view illustrating an intermediate product of the semiconductor device after regrowth of the semiconductor layer 110. The manufacturer then removes the insulating film 510B to form the convex 115B.

C2. Modification 2

According to the above embodiment, the N-type semiconductor layer 140 is placed at the position that does not overlap with the top face of the convex 115 in the stacking direction of the stacked body 100 (X-axis direction). The invention is, however, not limited to this configuration.

Figure 16:
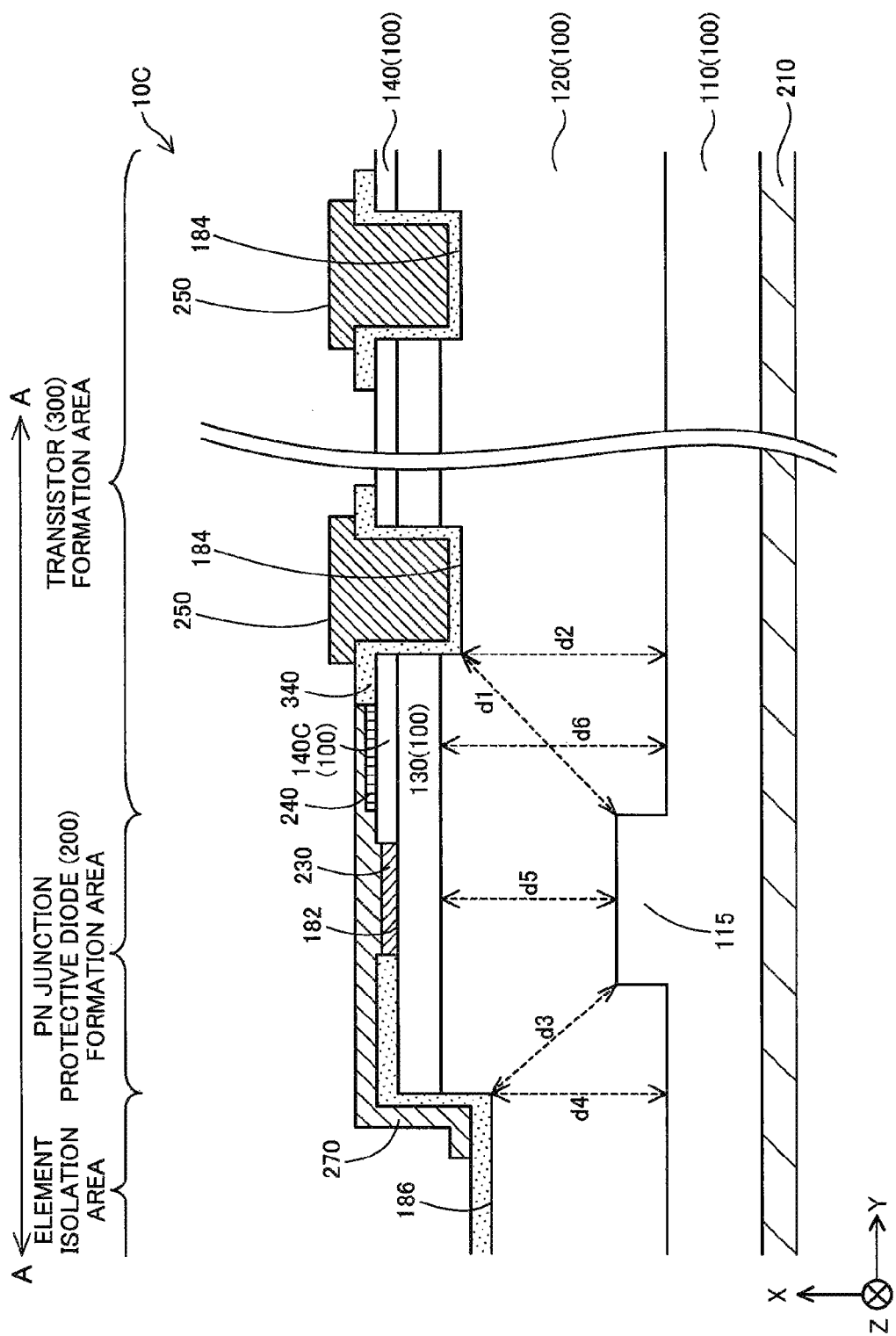
FIG. 16 is a sectional view schematically illustrating the configuration of a semiconductor device including an N-type semiconductor layer placed at a position to overlap with part of a top face of a convex in the stacking direction (X-axis direction)

FIG. 16 is a sectional view schematically illustrating the configuration of a semiconductor device 10C including an N-type semiconductor layer 140C placed at a position to overlap with part of the top face of the convex 115 in the stacking direction (X-axis direction). The N-type semiconductor layer 140C may be placed at the position to overlap with at least part of the top face of the convex 115.

C3. Modification 3

According to the above embodiment, the convex 115 is not located below (on the −X-axis direction side of) the step 186. The invention is, however, not limited to this configuration.

Figure 17:
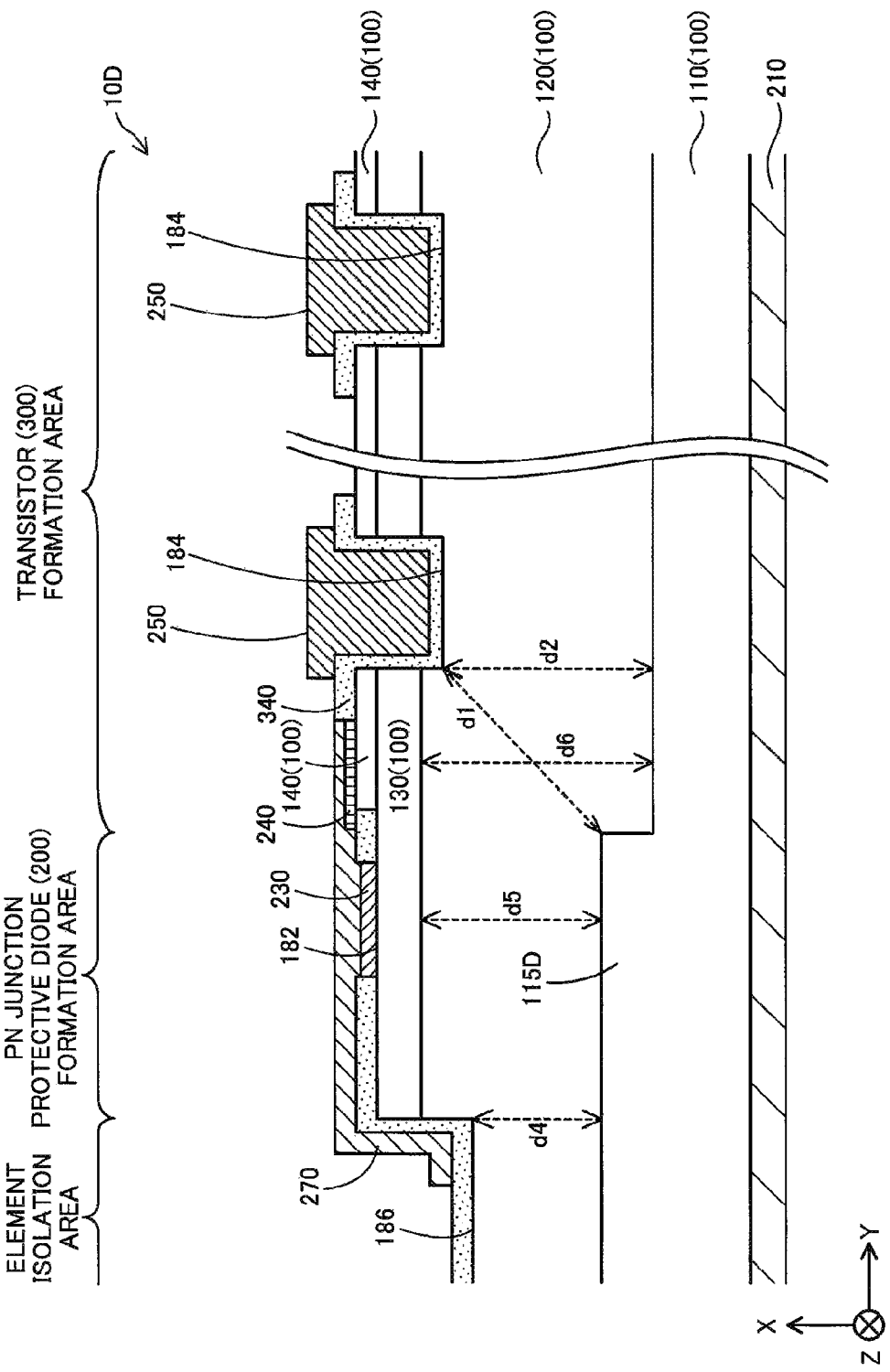
FIG. 17 is a sectional view schematically illustrating the configuration of a semiconductor device in which a convex is extended to below a step.

FIG. 17 is a sectional view schematically illustrating the configuration of a semiconductor device in which a convex 115D is extended to below the step 186. This modification facilitates formation of the convex 115D, compared with the manufacturing method for the above embodiment.

C4. Modification 4

The above embodiment uses silicon (Si) as the donor included in at least one of the substrate and the N-type semiconductor layer. The invention is, however, not limited to this embodiment but may use germanium (Ge) or oxygen (O) as the donor.

C5. Modification 5

The above embodiment uses magnesium (Mg) as the acceptor included in the P-type semiconductor layer. The invention is, however, not limited to this element but may use zinc (Zn) or carbon (C) as the acceptor.

C6. Modification 6

According to the above embodiment, the electrode 230 is made of palladium (Pd). The invention is, however, not limited to this configuration. The electrode 230 may be made of another material and may have a multi-layered structure. For example, the electrode 230 may be provided as an electrode containing at least one of conductive materials such as nickel (Ni), platinum (Pt) and cobalt (Co) and may have a two-layered structure such as nickel (Ni)/palladium (Pd) layered structure or platinum (Pt)/palladium (Pd) layered structure (where palladium is located on the semiconductor substrate side).

C7. Modification 7

According to the above embodiment, the electrode 250 as the gate electrode is made of aluminum (Al). The invention is, however, not limited to this configuration. The electrode 250 may be made of polysilicon. The electrode 250 may be made of another material and may have a multi-layered structure. For example, the electrode 250 may have a two-layered structure such as gold (Au)/nickel (Ni) layered structure, aluminum (Al)/titanium (Ti) layered structure or aluminum (Al)/titanium nitride (TiN) layered structure (where nickel, titanium and titanium nitride are located on the gate insulating film side). The electrode 250 may have a three-layered structure such as titanium nitride (TiN)/aluminum (Al)/titanium nitride (TiN) layered structure.

The invention is not limited to any of the embodiments and the modifications described above but may be implemented by a diversity of other configurations without departing from the scope of the invention. For example, the technical features of any of the embodiments and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The invention claimed is:
1. A semiconductor device, comprising:
a vertical MOS transistor including:
  a stacked body formed by stacking a first nitride semiconductor layer of a first conductive type, a second nitride semiconductor layer of the first conductive type, a third nitride semiconductor layer of a second conductive type and a fourth nitride semiconductor layer of the first conductive type in this sequence; and
  a first electrode arranged to be in contact with an opposite surface of the first nitride semiconductor layer that is opposite to a surface in contact with the second nitride semiconductor layer, wherein
  a trench is formed to pass through the third nitride semiconductor layer and the fourth nitride semiconductor layer and reach the second nitride semiconductor layer; and
a protective element including:
  the first electrode; and
  an ohmic electrode to the second conductive type arranged to be in contact with an opposite surface of the third nitride semiconductor layer that is opposite to a surface in contact with the second nitride semiconductor layer, wherein the second nitride semiconductor layer has a lower impurity concentration of the first conductive type than the first nitride semiconductor layer,
the first nitride semiconductor layer has a projection that is protruded toward the second nitride semiconductor layer, wherein
the projection has a top face placed at a position to overlap with at least part of the ohmic electrode to the second conductive type, when viewed from a stacking direction of the stacked body,
a thickness of the second nitride semiconductor layer in a portion which a bottom face of the trench is in contact with is greater than a thickness of the second nitride semiconductor layer in a portion which the top face of the projection is in contact with, and
a thickness of the first nitride semiconductor layer formed at the projection is greater than a thickness of the first nitride semiconductor layer formed under the trench.

2. The semiconductor device according to claim 1, wherein the fourth nitride semiconductor layer is placed at a position that does not overlap with the top face of the projection, when viewed from the stacking direction.

3. The semiconductor device according to claim 1, further comprising:
a step that is provided on an opposite side to a side where the trench is placed across the projection when viewed from the stacking direction and is formed to pass through the third nitride semiconductor layer and reach the second nitride semiconductor layer, wherein
the thickness of the second nitride semiconductor layer in the portion which the top face of the projection is in contact with is equal to or less than a thickness of the second nitride semiconductor layer in a portion which a bottom face of the step is in contact with.

4. The semiconductor device according to claim 3, wherein distance between the bottom face of the step and the projection is greater than the thickness of the second nitride semiconductor layer in the portion which the bottom face of the step is in contact with.

5. The semiconductor device according to claim 3, further comprising:
an ohmic electrode to the first conductive type arranged to be in contact with an opposite surface of the fourth nitride semiconductor layer that is opposite to a surface in contact with the third nitride semiconductor layer.

6. The semiconductor device according to claim 5, further comprising:
a first wiring configured to electrically connect the ohmic electrode to the first conductive type with the ohmic electrode to the second conductive type, wherein
the first wiring is arranged to cover a side face of the step via an insulating film.

7. The semiconductor device according to claim 1, wherein each of the first nitride semiconductor layer, the second nitride semiconductor layer, the third nitride semiconductor layer and the fourth nitride semiconductor layer is made of a gallium-containing nitride semiconductor.

8. The semiconductor device according to claim 1, wherein the first nitride semiconductor layer is made of gallium nitride.

9. The semiconductor device according to claim 8, wherein the first nitride semiconductor layer is a nitride gallium substrate.

10. The semiconductor device according to claim 9, wherein the projection has a side face that is inclined relative to a top face of the projection convex.

11. The semiconductor device according to claim 1, wherein the projection has a side face provided as an a-face or an m-face and a top face provided as a c-face.

12. The semiconductor device according to claim 1, wherein the trench comprises a plurality of trenches, and the projection comprises a rectangular shape and surrounds the plurality of trenches when viewed from the stacking direction of the stacked body.

13. The semiconductor device according to claim 1, further comprising:
an insulating film formed on the third nitride semiconductor layer and between the fourth nitride semiconductor layer and the ohmic electrode to the second conductive type, at least a portion of the insulating film overlapping the projection when viewed from the stacking direction of the stacked body.

14. The semiconductor device according to claim 13, further comprising:
a wiring layer formed on the second electrode and the insulating film, at least a portion of the wiring layer overlapping the projection when viewed from the stacking direction of the stacked body.

15. A semiconductor device, comprising:
a vertical MOS transistor region comprising:
a first electrode;
a stacked body comprising:
a first nitride semiconductor layer of a first conductive type formed on the first electrode;
a second nitride semiconductor layer of the first conductive type formed on the first nitride semiconductor layer;
a third nitride semiconductor layer of a second conductive type formed on the second nitride semiconductor layer; and
a fourth nitride semiconductor layer of the first conductive type formed on the third nitride semiconductor layer; and
a protective element region comprising:
the first electrode;
the stacked body, the first nitride semiconductor layer including a projection which protrudes away from the first electrode; and
a second electrode formed in contact with a surface of the third nitride semiconductor layer which is opposite the second nitride semiconductor layer, the second electrode overlapping at least a portion of a top face of the projection in a plan view, and a thickness of the second nitride semiconductor layer between the trench and the first nitride semiconductor layer being greater than a thickness of the second nitride semiconductor layer between the third nitride semiconductor layer and the top face of the projection,
wherein a thickness of the first nitride semiconductor layer formed at the projection is greater than a thickness of the first nitride semiconductor layer formed in the vertical MOS transistor region.

* * * * *